US006847191B1

United States Patent
Wang

(10) Patent No.: US 6,847,191 B1
(45) Date of Patent: Jan. 25, 2005

(54) POWER CONTROL DEVICE AND THE OPERATING METHOD THEREOF

(75) Inventor: Jack Wang, Taipei (TW)

(73) Assignee: Kinpo Electronics, Inc., Taipei (TW)

( * ) Notice: Subject to any disclaimer, the term of this patent is extended or adjusted under 35 U.S.C. 154(b) by 8 days.

(21) Appl. No.: 10/640,954

(22) Filed: Aug. 13, 2003

(51) Int. Cl.[7] ................................................. H02J 7/00

(52) U.S. Cl. ....................................................... 320/114

(58) Field of Search ................................. 320/114, 112, 320/107, 116; 307/66, 86; 396/409

(56) References Cited

U.S. PATENT DOCUMENTS 4,685,789 A * 8/1987 Kawamura et al. ......... 396/409
6,771,043 B2 * 8/2004 Matsunaga et al. ......... 320/114

* cited by examiner

Primary Examiner—Pia Tibbits
(74) Attorney, Agent, or Firm—J.C. Patents

(57) ABSTRACT

A power control device and the operating method thereof are provided. The present invention obtains the battery inner resistance by using the battery inner resistor detecting loading circuit. The voltage drop occurred in between the positive pole end and the negative pole end is calculated with such method when the power consuming device in the portable electronic device is operating. Thus, the power storage of the battery can be accurately detected.

12 Claims, 4 Drawing Sheets

US 6,847,191 B1

POWER CONTROL DEVICE AND THE OPERATING METHOD THEREOF

BACKGROUND OF THE INVENTION

1. Field of Invention

The present invention relates to a power controlling mechanism, and more particularly, to a power control device using the battery as its power and the operating method thereof.

2. Description of Related Art

For a portable electronic device using the battery as its power (such as the digital camera, the digital still camera (DSC), or the personal digital assistant (PDA), the detection of the battery power storage is a very important issue. The conventional method directly measures the voltage between the positive pole end and the negative pole end of the battery to determine whether the voltage is higher than a predetermined cut-off voltage or not, so as to determine whether the battery power is sufficient or not.

However, the characteristic of the battery inner resistor is not the same for the different types of batteries. The alkaline battery and the Ni-MH (Nickel Metal Hydride) battery are exemplified herein for description, wherein the inner resistance of the alkaline battery is greater than the inner resistance of the Ni-MH battery. FIG. 1 is a schematic diagram of a discharging curve of the alkaline battery and the Ni-MH battery. As shown in FIG. 1, when a power consuming device in the portable electronic device is active, a battery voltage drop occurs in both the alkaline battery and the Ni-MH battery over time. Moreover, since the battery inner resistance r1 of the alkaline battery is greater than the battery inner resistance r2 of the Ni-MH battery, the battery voltage drop in the device using the alkaline battery is faster (and also as its power is greater) than the battery voltage drop occurred in the device using the Ni-MH battery.

Using the conventional method to directly measure the battery voltage, when the power consuming device is not active, the battery voltage of the portable device using the alkaline battery is detected to be higher than the cut-off voltage. However, upon the power consuming device being active, the measured voltage of the battery may fall below the cut-off voltage due to the existence of the inner resistance. Moreover, if the user is not notified that the battery power is insufficient and that the battery needs to be replaced immediately, once the power consuming device is active, the portable device may fail to operate due to insufficient power.

On the other hand, a portable electronic device using the Ni-MH battery, when using the conventional method to the measure its battery voltage, one may find that when the power consuming device is not active, the Ni-MH measured voltage is lower compared to the voltage of the portable electronic device using the alkaline battery However, due to the lower inner resistance of the Ni-MH battery, when the power consuming device is active, the voltage drop is smaller compared to the voltage drop of the alkaline battery. As a result, the battery voltage measured for the Ni-MH battery is even higher than the cut-off voltage, which indicates that the battery still has sufficient power, so the device does not need to warn the user even though there may be not enough power to operate the portable electronic device. As a consequence, measuring the battery voltage directly by using the conventional method cannot accurately detect whether the battery power is sufficient for the device to operate normally or not. Accordingly, the user may not be able to determine the exact power storage of the battery and thus cannot replace the battery immediately to avoid the device from failing to operate. Therefore, there is a need as to how to accurately detect the power storage of the battery, which has urged developers to solve this critical issue, especially important for a reliable, normal operation of portable electronic devices.

SUMMARY OF THE INVENTION

To solve the problems mentioned above and others, a power control device and the operating method thereof are provided. The present invention obtains the battery inner resistance by using the battery inner resistor detecting loading circuit. The voltage drop occurred in between the positive pole end and the negative pole end is calculated with such method when the power consuming device in the portable electronic device is operating. Thus, the power storage of the battery can be accurately detected.

In order to achieve the object mentioned above and others, the present invention provides a power control device. The power control device is suitable for the portable electronic devices using the battery as its power. The portable electronic device comprises a power consuming device such as the charging circuit of the flasher, the back light driving circuit of the LCD (liquid crystal display), the motor driving circuit for moving the lens, or the amplifying circuit of the speaker. However, it will be apparent to one of the ordinary skill in the art that it is not necessarily limited by it. The power control device comprises a battery inner resistor detecting loading circuit, an A/D (analog to digital) converter, and a CPU (central processing unit). The battery inner resistor detecting loading circuit is electrically coupled to the battery and the CPU for detecting the battery inner resistance of the battery. The A/D converter is electrically coupled to the battery and the CPU, and performs an analog to digital conversion of the analog voltage of the battery and outputs a digital voltage. The CPU is electrically coupled to the battery inner resistor detecting loading circuit and the A/D converter, and controls the turning ON/OFF operation of the battery inner resistor detecting loading circuit. When measuring the battery voltage, in the case that the battery inner resistor detecting loading circuit is turned off, the CPU obtains a first battery voltage via the A/D converter. In a similar fashion, when measuring the battery voltage, in the case that the battery inner resistor detecting loading circuit is turned on, the CPU obtains a second battery voltage via the A/D converter. The battery inner resistance of the battery inner resistor can then be calculated according to the first battery voltage and the second battery voltage. Furthermore, the voltage drop of the battery is calculated according to the first battery voltage, the battery inner resistance, and the consuming current of the power consuming device. When the voltage obtained from subtracting the voltage drop from the first battery voltage is lower than the predetermined cut-off voltage, the user of the portable electronic device is warned, and the power of the portable electronic device is turned off.

In the embodiment of the present invention, the battery inner resistor detecting loading circuit comprises a resistor and a bipolar transistor. The resistor comprises a first terminal and a second terminal, and the first terminal of the resistor is electrically coupled to a terminal of the battery. The bipolar transistor comprises a collector, a base, and an emitter terminal, wherein the collector of the bipolar transistor is electrically coupled to the second terminal of the resistor, the base of the bipolar transistor is electrically coupled to the CPU, and the emitter of the bipolar transistor is electrically coupled to the other terminal of the battery.

In the preferred embodiment of the present invention, the predetermined cut-off voltage is adjustable.

In the preferred embodiment of the present invention, when the voltage obtained from subtracting the voltage drop from the first battery voltage is higher than the predetermined cut-off voltage, the portable electronic device can normally operate and the warning message "battery voltage is insufficient" is not issued.

In the preferred embodiment of the present invention, the portable electronic device can be the digital camera, the digital still camera (DSC), or the personal digital assistant (PDA), for example. However, it will be apparent to one of the ordinary skill in the art that it is not necessarily limited by it.

The present invention further provides a method for operating the power control device. The operating method is suitable for the portable electronic device using the battery as its power. The portable electronic device comprise a power consuming device such as the charging circuit of the flasher, the back light driving circuit of the LCD, the motor driving circuit for moving the lens, or the amplifying circuit of the speaker. However, it will be apparent to one of the ordinary skill in the art that it is not necessarily limited by it. The power control device comprises a battery inner resistor detecting loading circuit. In the operating method, at first, the battery inner resistor detecting loading circuit is turned off and the battery is measured to obtain a first battery voltage. Then, the battery inner resistor detecting loading circuit is turned on and the battery is measured to obtain a second battery voltage. Then, the battery inner resistance of the battery inner resistor in the battery is calculated according to the first battery voltage and the second battery voltage. The voltage drop of the battery is subsequently calculated according to the first battery voltage, the battery inner resistance, and the consuming current of the power consuming device. Following, a voltage is obtained from subtracting the voltage drop from the first battery voltage and compared to the predetermined cut-off voltage. If the voltage obtained from subtracting the voltage drop from the first battery voltage is lower than the predetermined cut-off voltage, the user of the portable electronic device is warned, and the power of the portable electronic device is turned off. Otherwise, if the voltage obtained from subtracting the voltage drop from the first battery voltage is higher than the predetermined cut-off voltage, the user of the portable electronic device is not warned, and the device can normally operate.

In summary, the present invention obtains the battery inner resistance by using the battery inner resistor detecting loading circuit. The voltage drop occurred in between the positive pole end and the negative pole end is calculated with such method when the power consuming device in the portable electronic device is operating. Thus, the power storage of the battery can be accurately detected.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Figure 1:
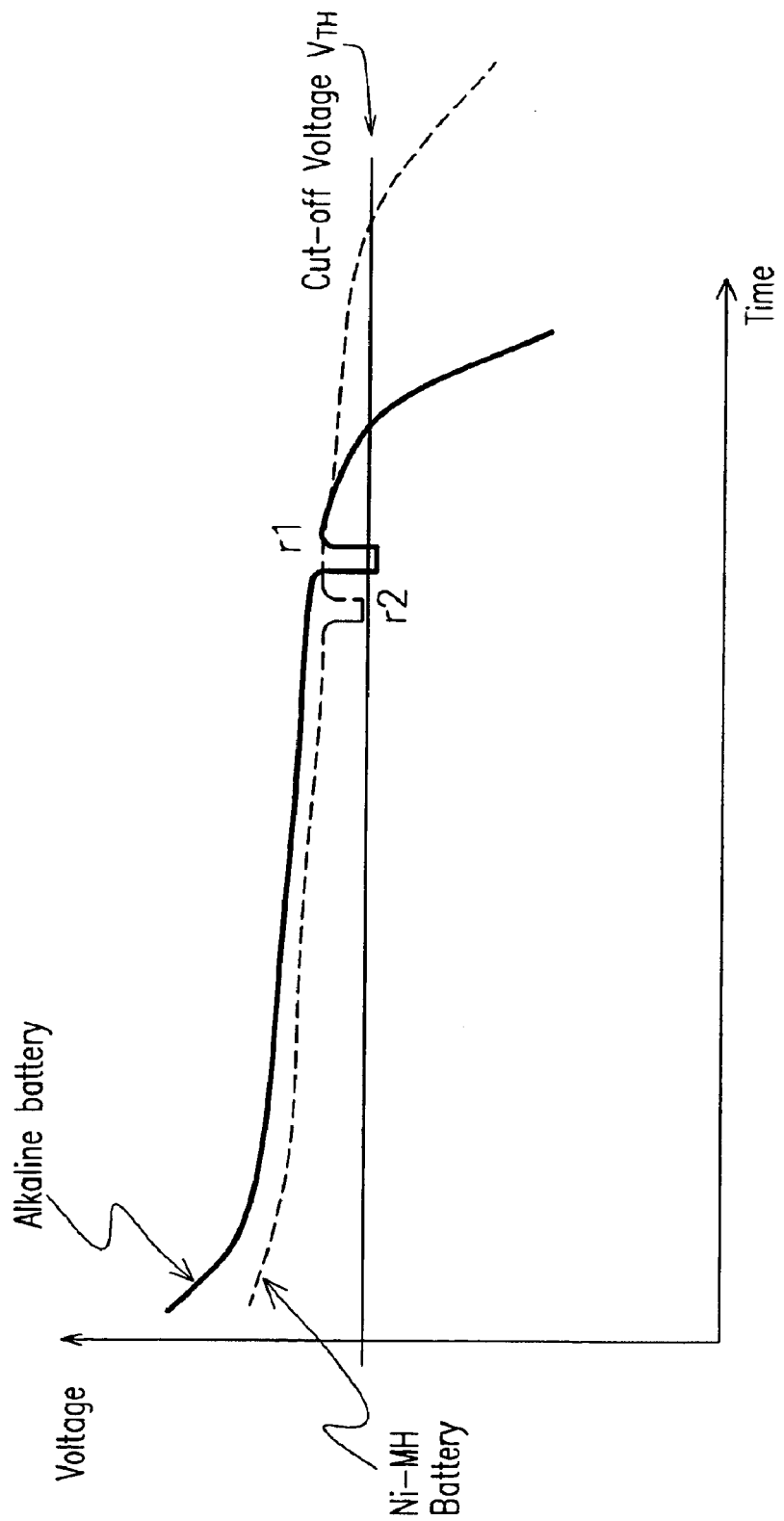
FIG. 1 is a schematic diagram of a discharging curve of the alkaline battery and the Ni-MH battery.
Figure 2:
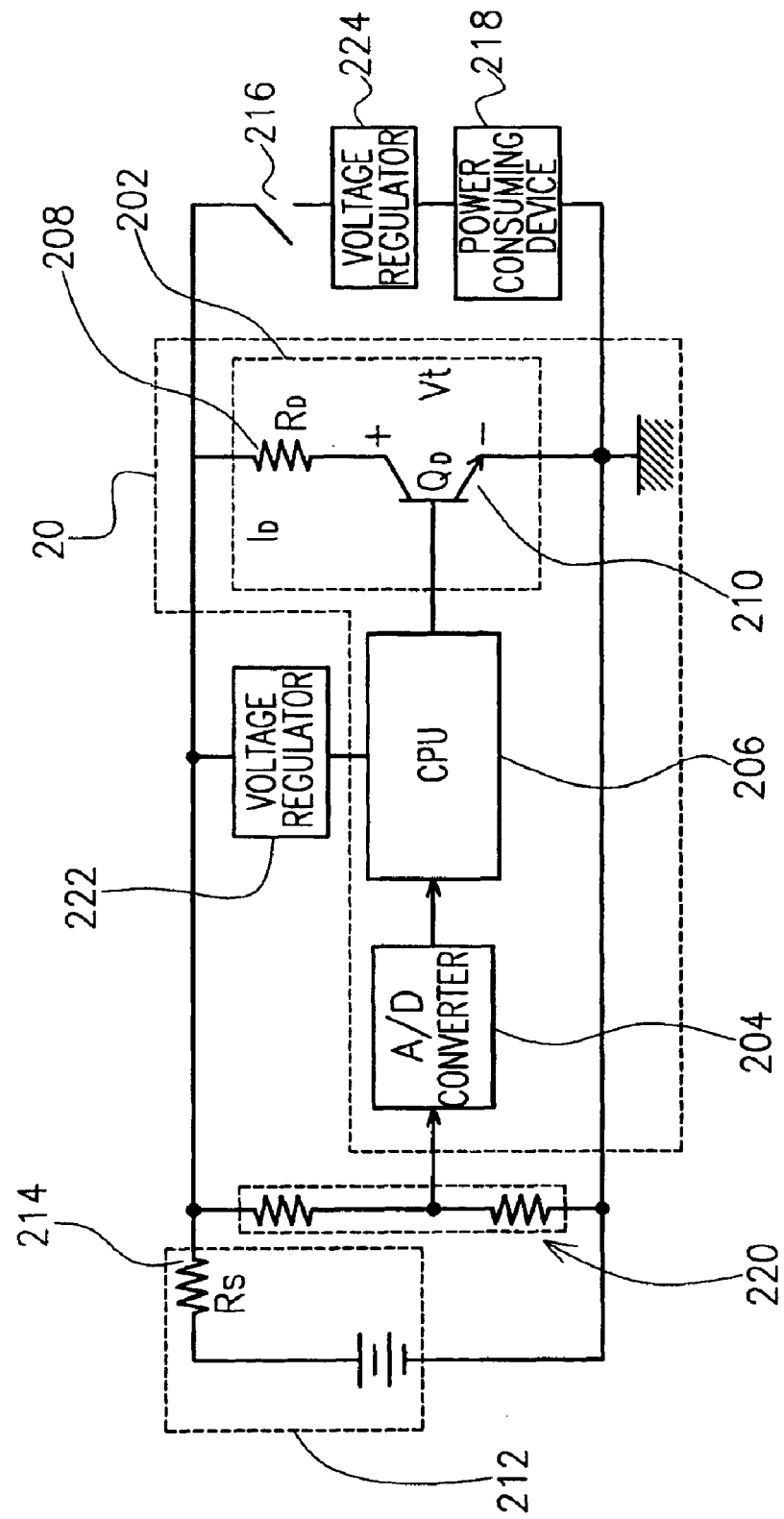
FIG. 2 is a schematic circuit diagram of a power control device of a preferred embodiment according to the present invention.

FIG. 2 is a schematic circuit diagram of a power control device of a preferred embodiment according to the present invention. The power control device is suitable for portable electronic devices using the battery as its power (such as the digital camera, the digital still camera (DSC), or the personal digital assistant (PDA)). Generally speaking, the portable electronic device comprises a power consuming device such as the charging circuit of the flasher, the back light driving circuit of the LCD, the motor driving circuit for moving the lens, the LCD back light driving circuit of the PDA or the amplifying circuit of the speaker. However, it will be apparent to one of the ordinary skill in the art that it is not necessarily limited by it. As shown in FIG. 2, the power control device 20 comprises a battery inner resistor detecting loading circuit 202, an A/D converter 204, and a CPU 206. The function of each component in the power control device 20 is described in detail hereinafter.

The battery inner resistor detecting loading circuit 202 helps in the determination of the battery inner resistance Rs of the battery. In the preferred embodiment, the battery inner resistor detecting loading circuit 202 comprises a resistor $R_D$ 208 and a bipolar transistor $Q_D$ 210. A terminal of the resistor $R_D$ 208 is electrically coupled to a terminal of the battery 212, and the other terminal of the resistor $R_D$ 208 is electrically coupled to the collector of the first transistor $Q_D$ 210. The base of the bipolar transistor $Q_D$ 210 is electrically coupled to the CPU 206, and the emitter of the bipolar transistor $Q_D$ 210 is electrically coupled to the other terminal of the battery 212.

The A/D converter 204 performs an analog to digital conversion of the analog voltage of the battery 212 and outputs a digital voltage to the CPU 206.

The CPU 206 controls the turning ON/OFF operation of the battery inner resistor detecting loading circuit 202. When calculating the battery inner resistance Rs, of the battery inner resistor 214 of the battery 212, the CPU 206 first turns off the bipolar transistor 210 and meanwhile the switch 216 is open (i.e. the power consuming device 218 is not connected to the circuit), then the battery 212 is measured and the CPU 206 obtains a first battery voltage $V_{DOFF}$ via the A/D converter 204. Then, the CPU 206 turns on the bipolar transistor 210 and meanwhile the switch 216 is still open, the battery 212 is measured and the CPU 206 obtains a second battery voltage $V_{DON}$ via the A/D converter 204. Moreover meanwhile, current $I_D$, flows through the battery inner resistor detecting loading circuit 202, producing a collector-emitter voltage Vt of the bipolar transistor 210 when turned on. Consequently, the relationship between the first battery voltage $V_{DOFF}$ and the second battery voltage $V_{DON}$ is expressed in the following equation (1) as:

$$V_{DOFF} - V_{DON} = I_D \times Rs = [(V_{DON} - Vt)/R_D] \times Rs \qquad (1)$$

Then, by rearranging equation (1), it is obtained that $Rs = [(V_{DOFF} - V_{DON})/(V_{DON} - Vt)] \times R_D$. When the switch 216 is short circuit, a voltage drop $V_{drop}$ occurs between the positive pole end and the negative pole end of the battery 212 when the power consuming device 218 is active consuming power, and is calculated according to the battery inner resistance Rs of the battery inner resistor 214 obtained from the above rearranged equation (1). Herein, it is assumed that the consuming current $I_L$ generally known from the technical specification of the power consuming device 218. Therefore, it is obtained that $V_{drop}=V_{DOFF}-(I_L \times Rs)=V_{DOFF}-\{I_L \times [(V_{DOFF}-V_{DON})/(V_{DON}-Vt)]\}$.

When the voltage obtained from subtracting the battery voltage drop $V_{drop}$ from the battery voltage $V_{DOFF}$ (i.e. the voltage that appears on battery 212 when the power consuming device 218 is consuming power) is lower than the predetermined cut-off voltage $V_{TH}$, the user of the portable electronic device is warned, and the power of the portable electronic device is turned off. Otherwise, if the voltage obtained from subtracting the battery voltage drop $V_{drop}$ from the battery voltage $V_{DOFF}$ is higher than the predetermined cut-off voltage $V_{TH}$, the portable electronic device can normally operate and the warning message "battery voltage is insufficient" is not issued. Moreover, wherein the cut-off voltage $V_{TH}$ is adjusted based on the physical requirement.

Figure 3:
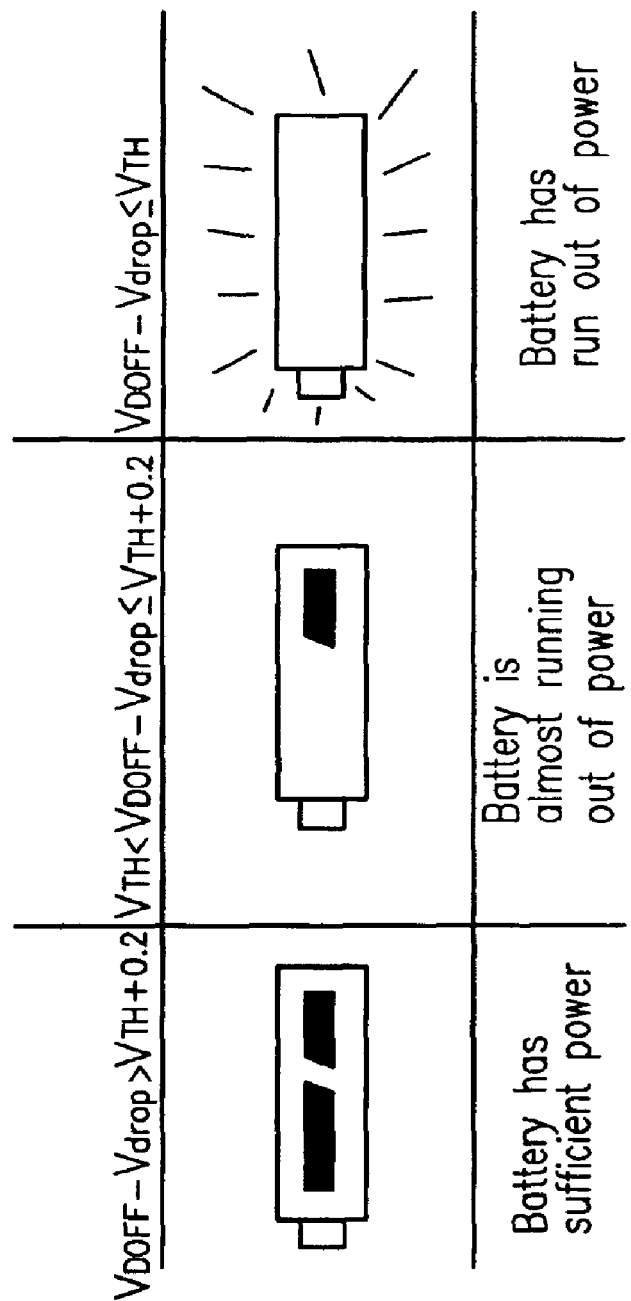
FIG. 3 is a schematic diagram of the power storage indicator of the battery in the portable electronic device of a power control device of a preferred embodiment according to the present invention.

FIG. 3 is a schematic diagram of the power storage indicator of the battery on the portable electronic device of a power control device of a preferred embodiment according to the present invention. As shown in FIG. 3a, when $V_{DOFF}-V_{drop}>(V_{TH}+0.2\ V)$, the power storage indicator shows that the battery 212 still has sufficient power to operate the portable electronic device normally. FIG. 3b shows that when $V_{TH}<V_{DOFF}-V_{drop}\leq(V_{TH}+0.2\ V)$, the power storage indicator shows that the battery 212 is almost running out power. And finally, in FIG. 3c, when $V_{DOFF}-V_{drop}\leq V_{TH}$, the power storage indicator shows that the battery 212 has run out of power.

It is to be mentioned that the voltage of the battery 212 is generally divided by a voltage dividing circuit 220, and the divided voltage is then supplied to the CPU 206 via the A/D converter 204. In order to obtain a required voltage, a first voltage regulator 222 and a second voltage regulator 224 are further provided.

Figure 4:
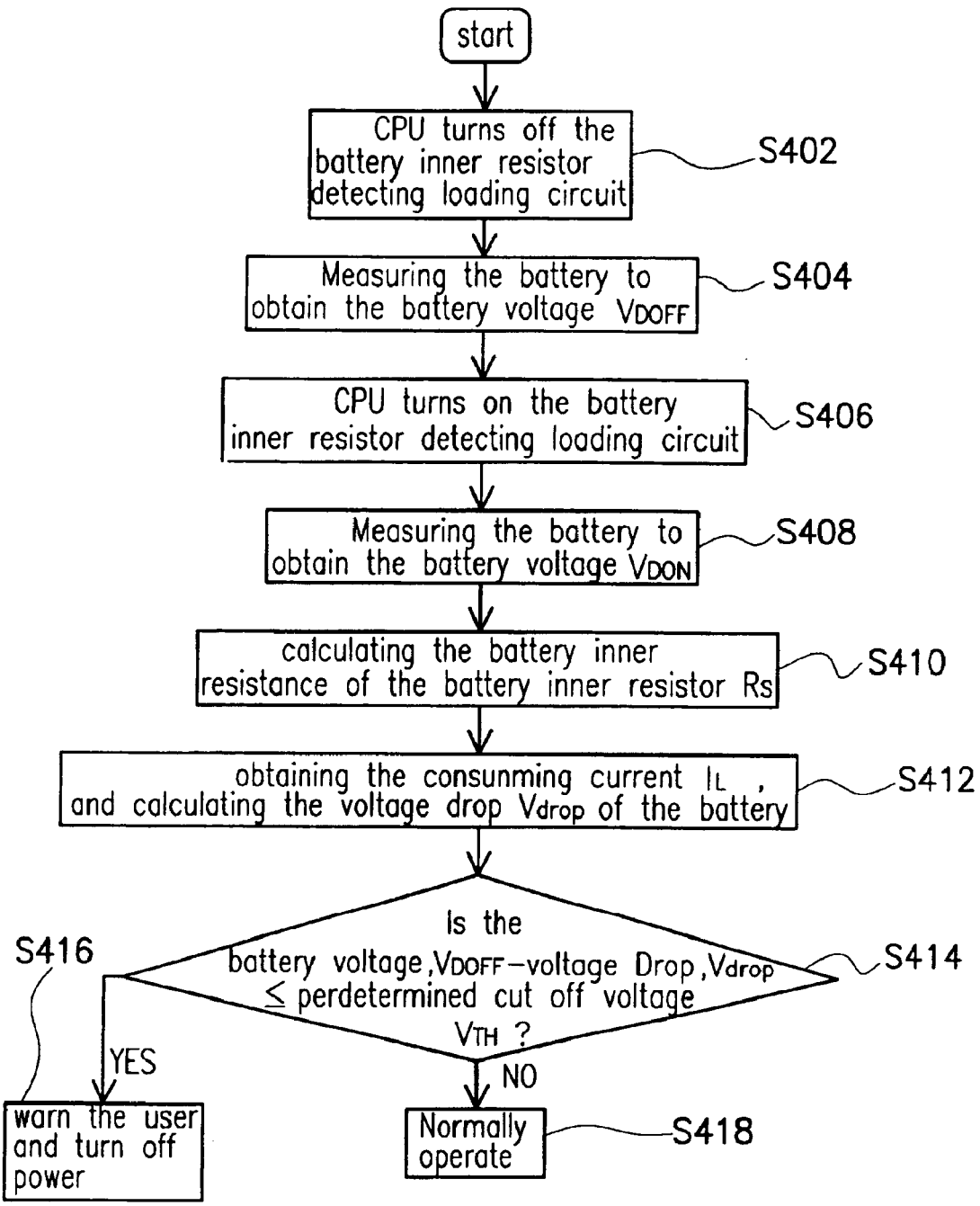
FIG. 4 schematically shows a flow chart illustrating a method for operating the power control device of a preferred embodiment according to the present invention.

To be more clarified, the method for operating the power control device of the present invention is described in detail hereinafter. FIG. 4 schematically shows a flow chart illustrating a method for operating the power control device of a preferred embodiment according to the present invention. Its operation is described below along with additionally referencing to FIG. 2.

In the operating method, at first, the CPU 206 turns off the battery inner resistor detecting loading circuit 202 (i.e. turning off the bipolar transistor 210) (step S402), and the battery 212 is measured. Then, the CPU 206 obtains a first battery voltage $V_{DOFF}$ via the A/D converter 204 (step S404).

The CPU 206 then turns on the battery inner resistor detecting loading circuit 202 (i.e. turning on the bipolar transistor 210) (step S406), and the battery 212 is measured. Then, the CPU 206 obtains a second battery voltage $V_{DON}$ via the A/D converter 204 (step S408).

The battery inner resistance Rs of the battery inner resistor 214 in the battery 212 is then calculated from equation (1), that is $Rs=[(V_{DOFF}-V_{DON})/(V_{DON}-Vt)] \times R_D$ (step S410).

The voltage drop $V_{drop}$ occurring between the positive pole end and the negative pole end of the battery 212 when the power consuming device 218 is active consuming power, is calculated according to the consuming current $I_L$ of the power consuming device 218, that is $V_{drop}=V_{DOFF}-(I_L \times Rs)=V_{DOFF}-\{I_L \times [(V_{DOFF}-V_{DON})/(V_{DON}-Vt)]\}$ (step S412).

Then, the voltage obtained from subtracting the battery drop $V_{drop}$ from the battery voltage $V_{DOFF}$ (that is, the voltage that appears in the battery 212 when the power consuming device 218 is active consuming power) is compared to determine whether it is lower than the predetermined cut-off voltage $V_{TH}$ or not (step S414).

If the above said voltage obtained (i.e., $V_{DOFF}-V_{drop}$) is lower than the predetermined cut-off voltage $V_{TH}$, the user of the portable electronic device is warned, and the power of the portable electronic device is turned off (step S416).

Otherwise, if the above said voltage obtained (i.e. $V_{DOFF}-V_{drop}$) is higher than the predetermined cut-off voltage $V_{TH}$, the portable electronic device can proceed to normally operate and the warning message "battery voltage is insufficient" is not issued (step S418).

In summary, the present invention obtains the battery inner resistance by using the battery inner resistor detecting loading circuit. The voltage drop occurred in between the positive pole end and the negative pole end is calculated with such method when the power consuming device in the portable electronic device is active. Thus, the power storage of the battery can be accurately detected.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A power control device suitable for a portable electronic device using a battery as a power, the portable electronic device comprising a power consuming device, and the power control device comprising:

a battery inner resistor detecting loading circuit electrically coupled to the battery for detecting a battery inner resistance of the battery;

an A/D (analog to digital) converter electrically coupled to the battery for performing an analog to digital conversion of an analog voltage of the battery and outputting a digital voltage; and a CPU (central processing unit) electrically coupled to the battery inner resistor detecting loading circuit and the A/D converter, for controlling the turning ON/OFF operation of the battery inner resistor detecting loading circuit, in order to measure the battery voltage in the case when the battery inner resistor detecting loading circuit is turned off, the CPU obtains a first battery voltage via the A/D converter, and also to measure the battery voltage in the case when the battery inner resistor detecting loading circuit is turned on, the CPU obtains a second battery voltage via the A/D converter then a battery inner resistance of a battery inner resistor in the battery is calculated according to the first battery voltage and the second battery voltage;

wherein, a voltage drop of the battery is calculated according to the first battery voltage, the battery inner resistance, and a consuming current of the power consuming device, when a voltage obtained from subtracting the voltage drop from the first battery voltage is lower than a predetermined cut-off voltage, a user of the portable electronic device is warned, and a power of the portable electronic device is turned off.

2. The power control device of claim 1, wherein the battery inner resistor detecting loading circuit comprises:

a resistor comprising a first terminal and a second terminal, and the first terminal of the resistor is electrically coupled to a terminal of the battery; and a bipolar transistor comprising a collector terminal, a base, and an emitter terminal, wherein the collector of the bipolar transistor is electrically coupled to the second terminal of the resistor, the base of the resistor is electrically coupled to the CPU, and the emitter of the bipolar transistor is electrically coupled to the other terminal of the battery.

3. The power control device of claim 1, wherein the predetermined cut-off voltage is adjustable.

4. The power control device of claim 1, wherein when the voltage obtained from subtracting the voltage drop from the first battery voltage is higher than the predetermined cut-off voltage, the portable electronic device can normally operate and the user is not warned.

5. The power control device of claim 1, wherein the portable electronic device comprises a digital camera, a digital still camera (DSC), and a personal digital assistant (PDA).

6. The power control device of claim 5, wherein the power consuming device comprises a charging circuit of a flasher, a back light driving circuit of a LCD, a motor driving circuit for moving a lens, and an amplifying circuit of a speaker.

7. A method for operating a power control device suitable for a portable electronic device using a battery as a power, the portable electronic device comprising a power consuming device, the power control device comprising a battery inner resistor detecting loading circuit, and the operating method comprising the following steps:

turning off the battery inner resistor detecting loading circuit and measuring the battery so as to obtain a first battery voltage;

turning on the battery inner resistor detecting loading circuit and measuring the battery so as to obtain a second battery voltage;

calculating a battery inner resistance of a battery inner resistor in the battery according to the first battery voltage and the second battery voltage;

calculating a voltage drop of the battery according to the first battery voltage, the battery inner resistance, and a consuming current of the power consuming device; and when a voltage obtained from subtracting the voltage drop from the first battery voltage is lower than a predetermined cutoff voltage, warning a user of the portable electronic device and turning off a power of the portable electronic device.

8. The method for operating the power control device of claim 7, wherein controlling the turning ON/OFF operation of the battery inner resistor detecting loading circuit is achieved by a CPU in the power control device.

9. The method for operating the power control device of claim 8, wherein when the battery is measured in the case that the battery inner resistor detecting loading circuit is turned off, the CPU obtains a first battery voltage via an A/D converter in the power control device.

10. The method for operating the power control device of claim 9, wherein when the battery is measured in the case that the battery inner resistor detecting loading circuit is turned on, the CPU obtains a second battery voltage via the A/D converter.

11. The method for operating the power control device of claim 7, wherein the predetermined cut-off voltage is adjustable.

12. The method for operating the power control device of claim 7, wherein when the voltage obtained from subtracting the voltage drop from the first battery voltage is higher than the predetermined cutoff voltage, the portable electronic device can normally operate and the user is not warned.

* * * * *